(12) United States Patent
Lee et al.

(10) Patent No.: US 8,081,711 B2
(45) Date of Patent: Dec. 20, 2011

(54) PREDISTORTION METHODS AND APPARATUS FOR POLAR MODULATION TRANSMITTERS

(75) Inventors: Wayne S. Lee, San Mateo, CA (US); Tony L. Wong, Hayward, CA (US); Herb Evans, Sunnyvale, CA (US)

(73) Assignee: Panasonic Corporation, Osaka (JP)

( * ) Notice: Subject to any disclaimer, the term of this patent is extended or adjusted under 35 U.S.C. 154(b) by 897 days.

(21) Appl. No.: 12/098,314

(22) Filed: Apr. 4, 2008

(65) Prior Publication Data

US 2009/0252255 A1   Oct. 8, 2009

(51) Int. Cl.
*H04L 25/49* (2006.01)

(52) U.S. Cl. ......................... 375/296; 375/297

(58) Field of Classification Search .................. 375/297, 375/296, 278, 284; 455/114.3, 114.2; 330/149
See application file for complete search history.

(56) References Cited

U.S. PATENT DOCUMENTS

| | | | | |
|---|---|---|---|---|
| 6,642,786 B1* | 11/2003 | Jin et al. | ......................... | 330/149 |
| 7,962,108 B1* | 6/2011 | Khlat et al. | ................. | 455/114.3 |
| 2002/0044014 A1* | 4/2002 | Wright et al. | ...................... | 330/2 |
| 2002/0094795 A1* | 7/2002 | Mitzlaff | ..................... | 455/245.1 |
| 2002/0196864 A1* | 12/2002 | Booth et al. | ................... | 375/296 |
| 2005/0156662 A1* | 7/2005 | Raghupathy et al. | ........... | 330/10 |
| 2009/0051425 A1* | 2/2009 | Mehta et al. | ................... | 330/149 |
| 2010/0233977 A1* | 9/2010 | Minnis et al. | ............... | 455/127.1 |

FOREIGN PATENT DOCUMENTS

WO   WO/2007/113726   * 10/2007

* cited by examiner

*Primary Examiner* — Chieh M Fan
*Assistant Examiner* — Aristocratis Fotakis

(57) ABSTRACT

Methods and apparatus for predistorting signals in a polar modulation transmitter. An exemplary method includes predistorting an envelope component signal in an amplitude path of a polar modulation transmitter according to a set of AM/AM predistortion coefficients, and predistorting a phase component signal in a phase path of the polar modulation transmitter according to a set of AM/PM predistortion coefficients. The AM/AM and AM/PM predistortion coefficients are stored in a memory in the form of a look up table (LUT). The envelope component signal is scaled and/or offset, before predistortion is applied, by an amount dependent upon which average power level of a plurality of average power levels the power amplifier of the polar modulation transmitter is configured to operate. Scaling and/or offsetting the envelope component signal prior to applying predistortion affords the ability to share the AM/AM and AM/PM predistortion coefficients of the predistortion LUT over the plurality of average power levels.

22 Claims, 18 Drawing Sheets

| | | | | |
|---|---|---|---|---|
| a1(P1) | a2(P1) | ... | a*l*(P1) |
| p1(P1) | p2(P1) | ... | p*l*(P1) |
| a1(P2) | a2(P2) | ... | a*l*(P2) |
| p1(P2) | p2(P2) | ... | p*l*(P2) |

PREDISTORTION LUT FOR AVERAGE POWER LEVEL P1
502-1

PREDISTORTION LUT FOR AVERAGE POWER LEVEL P2
502-2

⋮

| | | | | |
|---|---|---|---|---|
| a1(P*p*) | a2(P*p*) | ... | a*l*(P*p*) |
| p1(P*p*) | p2(P*p*) | ... | p*l*(P*p*) |

PREDISTORTION LUT FOR AVERAGE POWER LEVEL P*p*
502-*p*

FIGURE 5 (Prior Art)

| a1 | a2 | ... | an |
|---|---|---|---|
| p1 | p2 | ... | pn |

SHARED PREDISTORTION LUT 650

| | S1(P1) | O1(P1) | S2(P1) | O2(P1) |
|---|---|---|---|---|
| P1 | | | | |
| P2 | S1(P2) | O1(P2) | S2(P2) | O2(P2) |
| ⋮ | | ⋮ | | |
| Pm | S1(Pm) | O1(Pm) | S2(Pm) | O2(Pm) |

PRE AND POST PREDISTORTION SCALE AND OFFSET PARAMETERS

FIGURE 7

| | | | | | |
|---|---|---|---|---|---|
| SHARED PREDISTORTION LUT 650 | | a1 | a2 | ... | an |
| | | p1 | p2 | ... | pn |

| | | | | | |
|---|---|---|---|---|---|
| LOW ("L") BAND PRE AND POST PREDISTORTION SCALE AND OFFSET PARAMETERS | P1 | S1(P1,$f_L$) | O1(P1,$f_L$) | S2(P1,$f_L$) | O2(P1,$f_L$) |
| | P2 | S1(P2,$f_L$) | O1(P2,$f_L$) | S2(P2,$f_L$) | O2(P2,$f_L$) |
| | ⋮ | | | | |
| | Pm | S1(Pm,$f_L$) | O1(Pm,$f_L$) | S2(Pm,$f_L$) | O2(Pm,$f_L$) |
| MEDIAL ("M") BAND PRE AND POST PREDISTORTION SCALE AND OFFSET PARAMETERS | P1 | S1(P1,$f_M$) | O1(P1,$f_M$) | S2(P1,$f_M$) | O2(P1,$f_M$) |
| | P2 | S1(P2,$f_M$) | O1(P2,$f_M$) | S2(P2,$f_M$) | O2(P2,$f_M$) |
| | ⋮ | | | | |
| | Pm | S1(Pm,$f_M$) | O1(Pm,$f_M$) | S2(Pm,$f_M$) | O2(Pm,$f_M$) |
| HIGH ("H") BAND PRE AND POST PREDISTORTION SCALE AND OFFSET PARAMETERS | P1 | S1(P1,$f_H$) | O1(P1,$f_H$) | S2(P1,$f_H$) | O2(P1,$f_H$) |
| | P2 | S1(P2,$f_H$) | O1(P2,$f_H$) | S2(P2,$f_H$) | O2(P2,$f_H$) |
| | ⋮ | | | | |
| | Pm | S1(Pm,$f_H$) | O1(Pm,$f_H$) | S2(Pm,$f_H$) | O2(Pm,$f_H$) |

FIGURE 12

PREDISTORTION METHODS AND APPARATUS FOR POLAR MODULATION TRANSMITTERS

FIELD OF THE INVENTION

The present invention relates to distortion in radio frequency transmitters. More specifically, the present invention relates to methods and apparatus for countering power amplifier induced distortion in polar modulation transmitters.

BACKGROUND OF THE INVENTION

The polar modulation transmitter is a type of radio frequency (RF) transmitter commonly used in wireless communications. The principal elements of a polar modulation transmitter 100 are shown in FIG. 1. They include a baseband processor 102; a COordinate Rotation DIgital Computer converter (CORDIC) 104; an amplitude path digital-to-analog converter (DAC) 106 and an envelope modulator 108 in an amplitude path; a phase path DAC 110 and an RF oscillator 112 in a phase path; a power amplifier (PA) 114; and an antenna 116.

During operation, the baseband processor 102 generates digital in-phase (I) and quadrature phase (Q) signals from a digital message to be transmitted. The CORDIC converter 104 converts the rectangular-coordinate digital I and Q into polar-coordinate digital envelope and phase component signals ρ and θ. The envelope and phase path DACs 106 and 110 convert the digital envelope and phase component signals ρ and θ into analog envelope modulation and phase modulation signals. The envelope modulator 108 modulates a DC power supply 118 according to amplitude variations in the analog envelope modulation signal, thereby generating an amplitude modulated power supply signal. Meanwhile, the analog phase modulation signal in the phase path is used to modulate an RF carrier signal generated by the RF oscillator 112. The resulting phase modulated RF signal is coupled to an RF input of the PA 114, and the amplitude modulated power supply signal from the envelope modulator 108 is coupled to a power supply input of the PA 114.

Because the phase modulated RF signal has a constant envelope, the PA 114 can be configured to operate in its nonlinear region of operation, where it is much more efficient in converting DC power from the DC power supply 118 to RF power than it is when configured to operate in its linear region. Typically, the PA 114 is implemented as a Class D, E or F switch-mode PA 114 operating in compression, so that the output power of the PA 114 is directly controlled by the amplitude modulated power supply signal applied to the power supply input of the PA 114. Hence, the PA 114 effectively operates as an amplitude modulator, amplifying the constant-envelope phase modulated RF signal according to amplitude variations in the amplitude modulated power supply signal, to produce a PA output signal that is both amplitude and phase modulated.

Operating the PA 114 in its nonlinear region, where it is most efficient, is highly desirable, particularly in battery-powered applications where power efficiency is an overriding concern. However, when it is operated in its nonlinear region, the PA 114 undesirably distorts the signals it amplifies. One type of distortion, known as amplitude modulation to amplitude modulation (or "AM/AM") distortion, results from the fact that the gain of the PA 114 compresses for higher values of input voltage (i.e., for higher amplitudes of the amplitude modulated power supply signal applied to the power supply input of the PA 114). This AM/AM distortion effect is illustrated in FIG. 2. Another type of distortion, known as amplitude modulation to phase modulation (or "AM/PM") distortion, results from an undesirable phase modulation of the PA output signal by an out-of-phase signal leaked from the RF input of the PA 114 to the RF output of the PA 114. The degree of AM/PM distortion introduced into the output signal depends on the amplitude of the amplitude modulated power supply signal relative to the amplitude of the leaked signal. Generally, the larger the amplitude of the leaked signal is relative to the amplitude of the amplitude modulated power supply signal, the larger the amount of AM/PM distortion.

AM/AM and AM/PM distortion can make it difficult to comply with noise specifications set forth by wireless communications standards. Fortunately, various linearization techniques are available to negate or counteract the effects of AM/AM and AM/PM distortion, yet which still allow the PA 114 to be operated efficiently in its nonlinear region. One approach involves predistorting the signals in the amplitude and phase paths according to inverses of known AM/AM and AM/PM distortion responses of the PA 114, so that the applied predistortions counteract the AM/AM and AM/PM distortions caused by the PA 114. FIG. 3 illustrates, for example, how a signal is predistorted according to an inverse of a known AM/AM distortion response, so that AM/AM distortion caused by the PA 114 is counteracted. The amplitude response of the PA with the predistortion having been applied is seen to more closely resemble an ideal PA response compared to if no predistortion had been applied.

FIG. 4 is a diagram illustrating how the polar modulation transmitter 100 in FIG. 1 is typically modified to include the ability to apply AM/AM and AM/PM predistortion to the digital envelope and phase component signals ρ and θ. A controller 406 of the modified polar modulation transmitter 400 retrieves AM/AM and AM/PM predistortion coefficients from a memory 408, and provides the coefficients to AM/AM and AM/PM predistorters 402 and 404, which operate to predistort the digital envelope and phase component signals ρ and θ according to the retrieved AM/AM and AM/PM predistortion coefficients.

In a typical configuration, the AM/AM and AM/PM predistortion coefficients are stored in the memory 408 as a plurality of LUTs 502-1, . . . , 502-p (p is an integer greater than or equal to one), as illustrated in FIG. 5. The plurality of LUTs 502-1, . . . , 502-p corresponds to a plurality of average power levels P1, P2, . . . , Pp the PA 114 can be commanded to operate. Each LUT of the plurality of LUTs 502-1, . . . , 502-p includes a unique set of digital AM/AM predistortion coefficients a1(Px), a2(Px), . . . , al(Px) and a corresponding unique set of digital AM/PM predistortion coefficients p1(Px), p2(Px), . . . , pl(Px), where l is an integer greater than or equal to two and x={1, . . . , p}. The l different AM/AM and AM/PM predistortion coefficients in a selected LUT provide the ability to predistort the digital envelope and phase component signals ρ and θ at l different predistortion levels. Which particular LUT of the plurality of LUTs 502-1, . . . , 502-p is selected is determined by a transmit power level signal received by the controller 406 from the baseband processor 102. Once a particular LUT has been selected, the controller 406 retrieves AM/AM and AM/PM predistortion coefficients from the selected LUT according to the amplitudes represented in the digital values of the digital envelope component signal ρ.

The digital AM/AM and AM/PM predistortion coefficients a1(Px), a2(Px), . . . , al(Px) and p1(Px), p2(Px), . . . , pl(Px) of the plurality of LUTs 502-1, . . . , 502-p are determined by performing a distortion characterization process on the PA 114, before the polar modulation transmitter 100 is put into service. The distortion characterization process includes measuring the AM/AM and AM/PM distortion behavior of the PA 114 at each of the different average power levels P1, P2, ..., Pp, calculating the digital values of the digital AM/AM and AM/PM predistortion coefficients a1(Px), a2(Px), ..., al(Px) and p1(Px), p2(Px), ..., pl(Px) from the measured AM/AM and AM/PM distortion behavior for each of the average power levels P1, P2, ..., Pp, and evaluating, at each of the average power levels P1, P2, ..., Pp, the effectiveness of the calculated digital AM/AM and AM/PM predistortion coefficients a1(Px), a2(Px), ..., al(Px) and p1(Px), p2(Px), ..., pl(Px) at countering the AM/AM and AM/PM distortion caused by the PA 114. If the polar modulation transmitter 400 is operable over multiple frequency bands, then further characterization is performed for each of the frequency bands and again for each of the average power levels P1, P2, ..., Pp. As will be appreciated by those of ordinary skill in the art, this distortion characterization process can be very time consuming, particularly when there are a large number p of power levels and frequency bands involved.

The distortion characterization process is not only time-consuming, but the amount of memory needed to store the plurality of LUTs 502-1, ..., 502-p can be quite large. In most modern-day polar modulation transmitter architectures, the memory 408 is formed on the same integrated circuit (IC) chip as other elements of the transmitter 400. To economize the design and leave room for the other elements, it is, therefore, important that the LUTs 502-1, ..., 502-p occupy as little of the memory 408 as possible. Unfortunately, this may be difficult or even impossible to achieve. In a Global System for Mobile Communications (GSM)/Enhanced Data Rate for GSM Evolution (EDGE) cellular communications application, for example, predistortion coefficients are determined from a characterization of the PA 114 at sixteen (16) different average power levels and then repeated for each GSM/EDGE frequency band. In a Wideband Code Division Multiple Access (W-CDMA) application, the PA 114 can be commanded to operate at up to eighty (80) different average power levels. The required memory space would, therefore, have to be at least five times larger than in a GSM/EDGE application. In a design originally targeted at a GSM/EDGE application, the memory space needed to accommodate the predistortion LUTs for each of these eighty different power levels would likely not be available. In order to accommodate all of the predistortion coefficients, therefore, the IC would have to be redesigned to include the needed additional memory.

In addition to time-consuming characterization and limitations on available memory, the predistortion coefficients of the plurality of LUTs 502-1, ..., 502-p must be downloaded into the memory 408 (e.g., from an external FLASH memory device) each time power is cycled. The more memory the plurality of LUTs 502-1, ..., 502-p occupy, the longer the download time is. If the download time is excessive, it can be an annoyance to users of the communications device in which the polar modulation transmitter 400 is being used.

It would be desirable, therefore, to have methods and apparatus for predistorting communications signals that do not require time consuming characterization processes and which do not require large amounts of memory to store predistortion LUTs.

SUMMARY OF THE INVENTION

Methods and apparatus for predistorting signals in a polar modulation transmitter, to counteract power-amplifier-induced amplitude modulation to amplitude modulation (AM/AM) and amplitude modulation to phase modulation (AM/PM) distortion, are disclosed. An exemplary method includes predistorting an envelope component signal in an amplitude path of the polar modulation transmitter according to a set of AM/AM predistortion coefficients and predistorting a phase component signal in a phase path of the polar modulation transmitter according to a set of AM/PM predistortion coefficients. The sets of AM/AM and AM/PM predistortion coefficients are stored in a memory in the form of a look up table (LUT) and are shared over a plurality of average power levels the power amplifier of the polar modulation transmitter is configurable to operate.

According to one aspect of the invention, the envelope component signal is scaled and/or offset by average-power-level-dependent pre predistortion scale and offset parameters before predistortion is applied to the envelope component signal. Scaling and/or offsetting the envelope component signal afford(s) the ability to share the AM/AM and AM/PM predistortion coefficients of the predistortion LUT over the plurality of average power levels. The ability to share the same predistortion LUT over the plurality of average power levels obviates the need to determine and store multiple predistortion LUTs for multiple average power levels. Hence, substantially less memory is needed to store the AM/AM and AM/PM predistortion coefficients compared to prior art approaches, and the test, characterization and evaluation time needed to determine the AM/AM and AM/PM predistortion coefficients is substantially reduced compared to prior art approaches.

According to another aspect of the invention, the PA of the polar modulation transmitter is configurable to operate in either a compressed mode or a linear mode, and according to a plurality of different frequency bands. To account for frequency dependent variations of the PA gain in compressed mode operation, frequency-band-dependent pre and post pre predistortion scale and offset parameters are determined and stored for use at each of the different frequency bands and for each of compressed mode average power level the PA can be commanded to operate when in compressed mode. When the PA is configured to operate in linear mode, the pre and post predistortion scale and offset parameters are held constant over the various frequency bands for each linear mode average power level the PA of the polar modulation transmitter can be commanded to operate in linear mode, and frequency dependent variations of the gain of the PA are accounted for by applying frequency-band-dependent gain control parameters to a variable gain amplifier (VGA) or step attenuator configured in the phase path of the polar modulation transmitter just before the PA.

Further features and advantages of the present invention, including exemplary methods of determining the AM/AM and AM/PM predistortion coefficients of the shared predistortion LUT and the pre and post predistortion scale and offset parameters for different operating modes of the PA and polar modulation transmitter, as well as the structure and operation of the above-summarized and other exemplary embodiments of the invention, are described in detail below with respect to accompanying drawings, in which like reference numbers are used to indicate identical or functionally similar elements.

BRIEF DESCRIPTION OF THE DRAWINGS

FIG. 5 is a drawing conceptually illustrating how the memory of the conventional polar modulation transmitter in FIG. 4 is configured to store a plurality of predistortion LUTs containing a plurality of unique AM/AM and AM/PM predistortion coefficients for a corresponding plurality of average power levels the PA of the polar modulation transmitter can be commanded to operate.

FIG. 7 is a drawing conceptually illustrating how the shared predistortion LUT used to predistort signals in the amplitude and phase paths of the polar modulation transmitter in FIG. 6 is stored, along with other pre and post predistortion parameters;

FIG. 12 is a drawing illustrating how the memory of the polar modulation transmitter in FIG. 13 is configured to store frequency-band-dependent pre and post predistortion scale and offset parameters for each compressed mode average power level of a plurality of compressed mode average power levels, according to an embodiment of the present invention;

DETAILED DESCRIPTION

Figure 1:
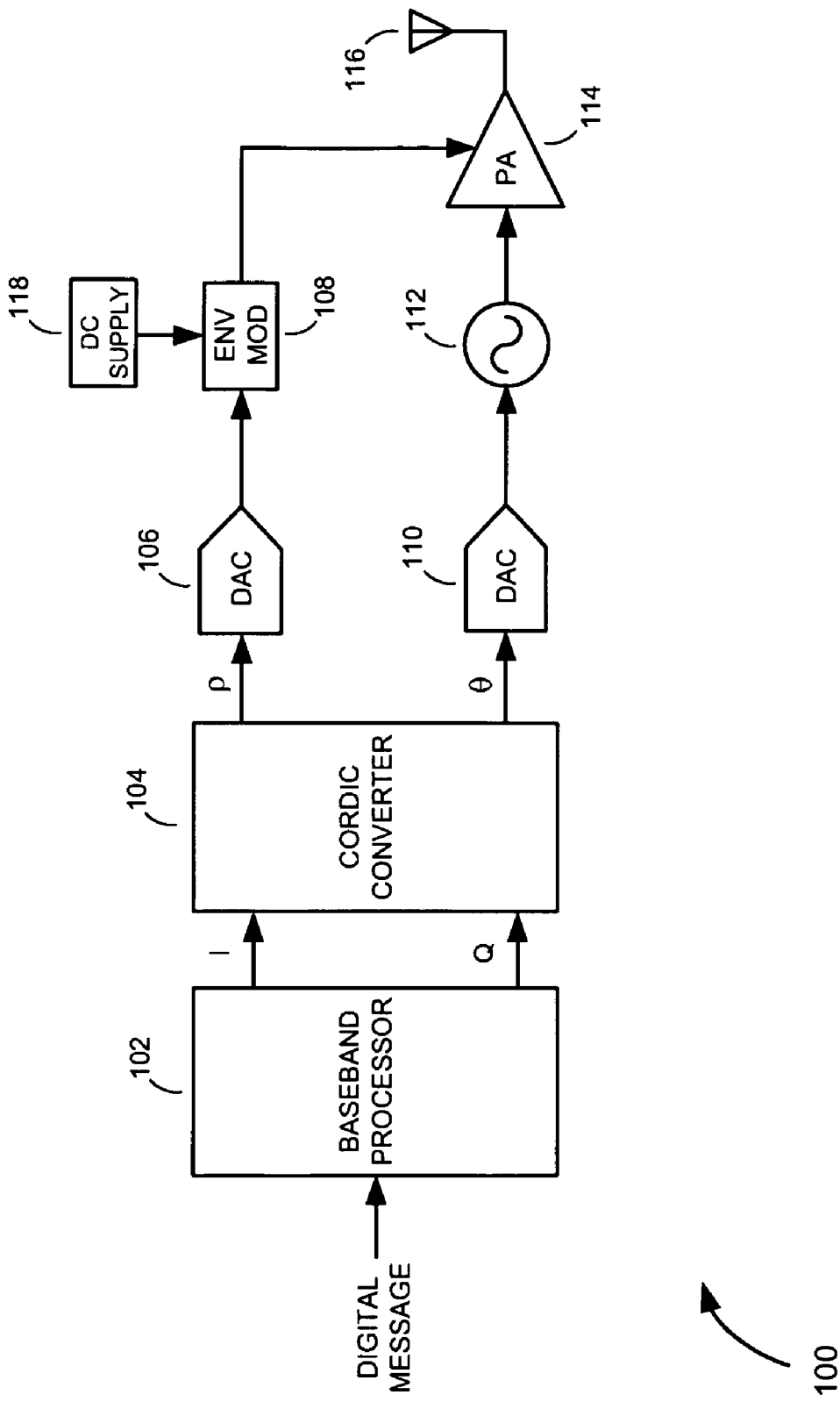
FIG. 1 is a drawing of a conventional polar modulation transmitter.
Figure 2:
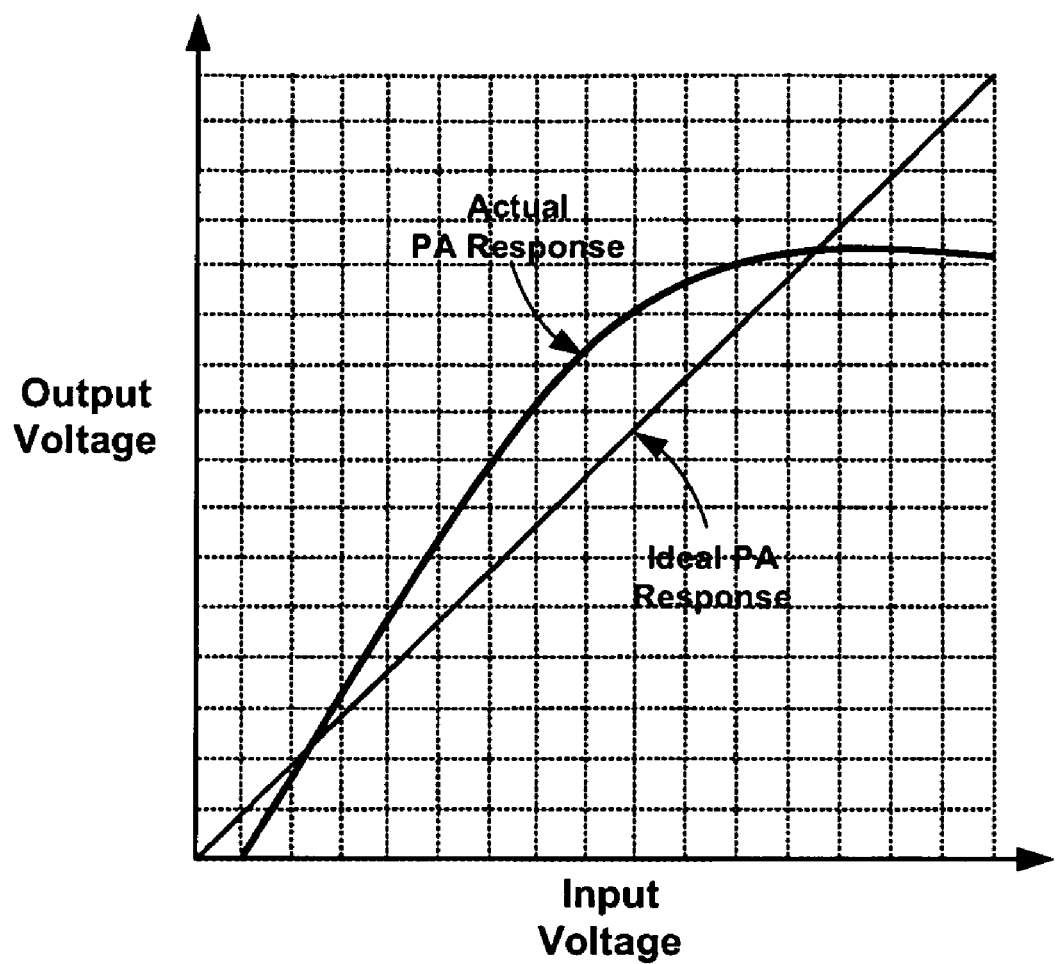
FIG. 2 is a graph illustrating how amplitude modulation to amplitude modulation (AM/AM) distortion caused by a power amplifier (PA) causes an actual PA response to deviate from an ideal PA response.
Figure 3:
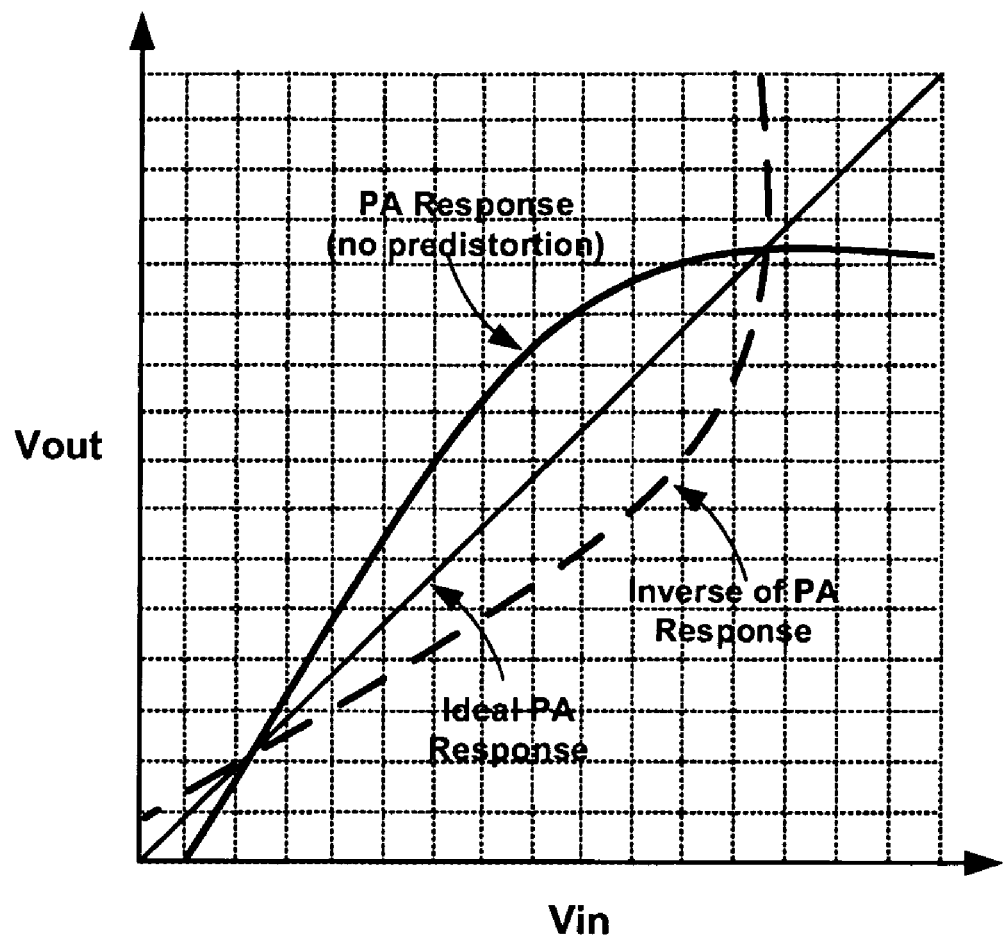
FIG. 3 is a graph illustrating how predistorting a signal according to an inverse of a known AM/AM distortion response of a PA, counters AM/AM distortion caused to the signal by the PA, so that the PA response more closely resembles an ideal PA response compared to if no predistortion had been applied.
Figure 4:
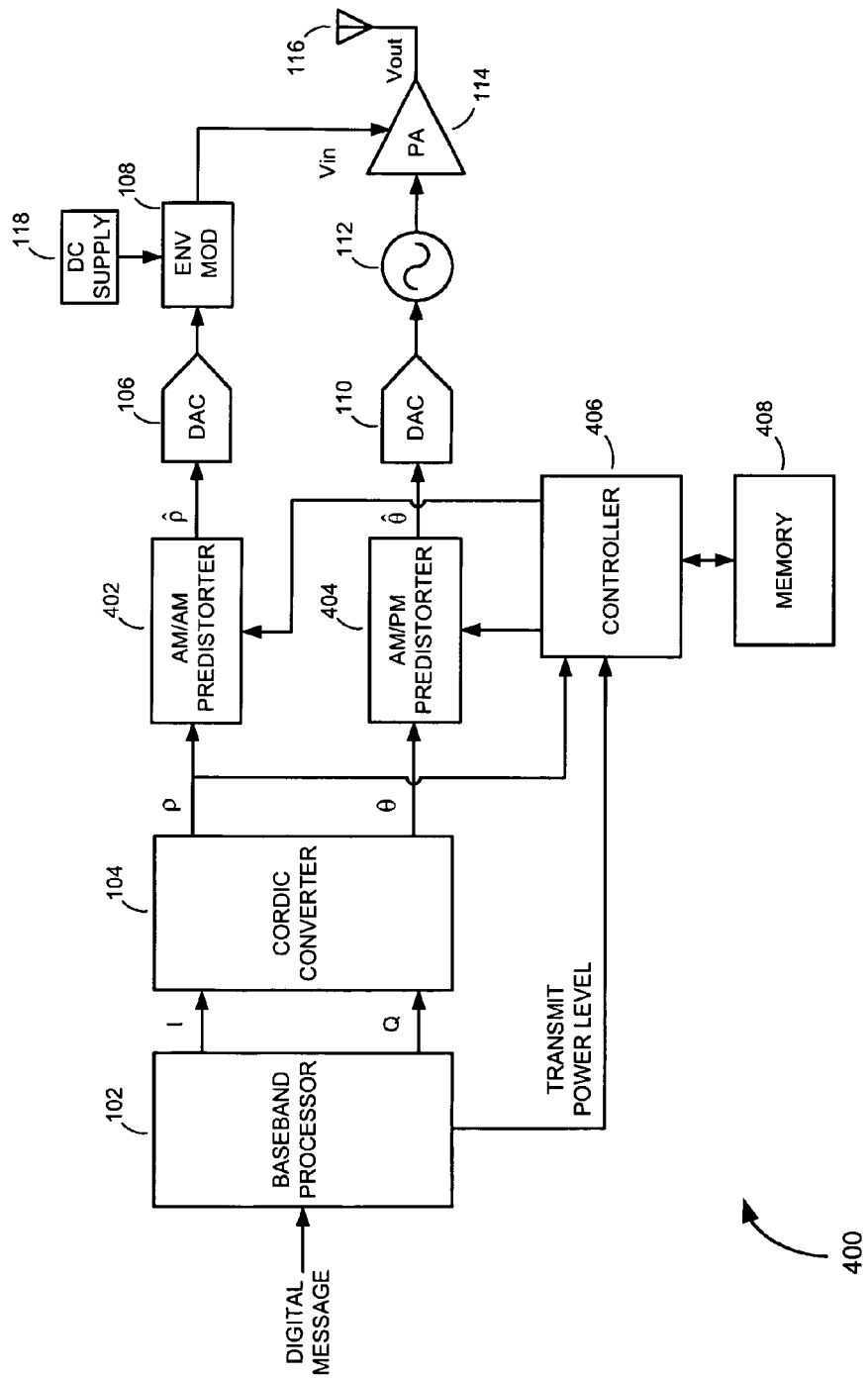
FIG. 4 is a diagram illustrating how the polar modulation transmitter in FIG. 1 is typically modified to include the ability to predistort signals in amplitude and phase paths of the polar modulation transmitter.
Figure 6:
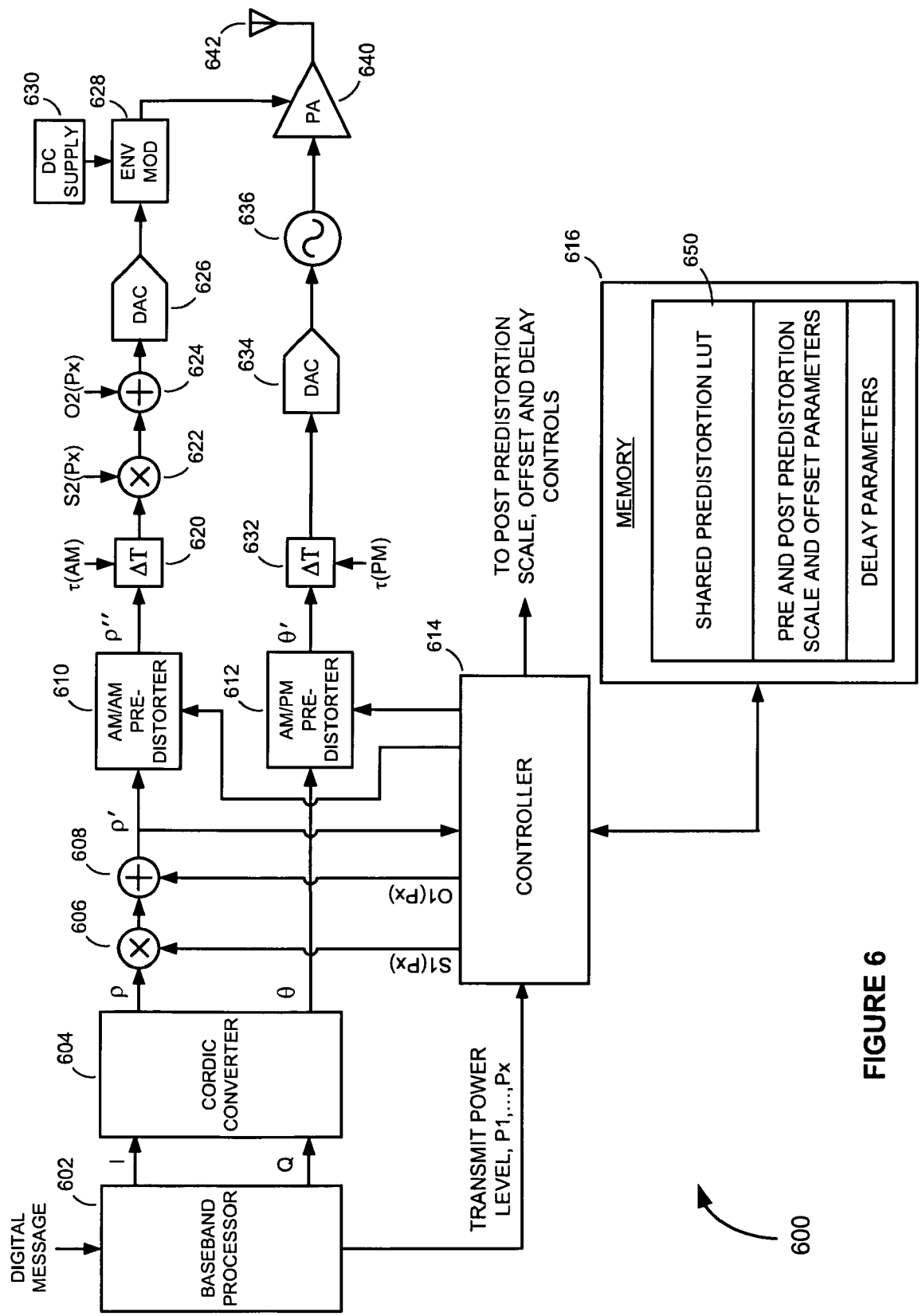
FIG. 6 is a drawing of a polar modulation transmitter, according to an embodiment of the present invention.

Referring to FIG. 6, there is shown a polar modulation transmitter 600, according to an embodiment of the present invention. The polar modulation transmitter 600 includes a baseband processor 602; a CORDIC converter 604; an AM/AM predistorter 610 disposed in an amplitude path; a first multiplier 606 and a first summer 608 coupled between an output of the CORDIC converter 604 and an input of the AM/AM predistorter 610 in the amplitude path; an AM/PM predistorter 612 disposed in a phase path; a controller 614; and a memory 616 that is configured to store, among other things, a predistortion LUT 650. Following the AM/AM predistorter 610 in the amplitude path is an amplitude path delay element 620; a second multiplier 622; a second summer 624; an amplitude path digital to analog converter DAC 626; and an envelope modulator 628. Following the AM/PM predistorter 612 in the phase path is a phase path delay element 632; a phase path DAC 634, and an RF oscillator 636. An output of the envelope modulator 628 in the amplitude path is coupled to a power supply input of a power amplifier (PA) 640, and an output of the RF oscillator 636 in the phase path is coupled to an RF input of the PA 640. The PA 640 has an output that is coupled to an antenna 642.

During operation, the baseband processor 602 generates rectangular-coordinate digital I and Q signals from an incoming digital message. The CORDIC converter 604 converts the rectangular-coordinate digital I and Q signals into polar-coordinate digital envelope and phase component signals ρ and θ. Prior to predistorting the digital envelope component signal ρ, the digital envelope signal ρ is digitally scaled and offset by the first multiplier 606 and the first summer 608. As explained in more detail below, the degree to which the digital envelope component signal ρ is scaled and offset is determined by which average power level of a plurality of average power levels P1, P2, . . . , Pm (m is an integer greater than or equal to two) the PA 640 is configured to operate.

The resulting scaled and offset digital envelope component signal ρ' is used as an index by the controller 614 to select the AM/AM and AM/PM predistortion coefficients from the predistortion LUT 650 stored in the memory 616. The controller 614 may be combined with other signal processing functions in the baseband processor 602, as will be appreciated by those of ordinary skill in the art. Alternatively, the controller 614 may be configured as a sequencer that operates in cooperation with the baseband processor 102, similar to the sequencer shown and described in commonly assigned U.S. patent application Ser. No. 11/876,075, the disclosure of which is hereby incorporated by reference.

FIG. 7 conceptually illustrates how the predistortion LUT 650 is stored in the memory 616, along with pre predistortion scale and offset parameters S1(Px) and O1(Px) and post predistortion scale and offset parameters S2(Px) and O2(Px), where x={1, ..., m} The predistortion LUT 650 comprises a set of n AM/AM predistortion coefficients {a1, ..., an} and a corresponding set of n AM/PM predistortion coefficients {p1, ..., pn}, where n is an integer representing the total number of predistortion coefficients in each of the sets.

The n different AM/AM and AM/PM predistortion coefficients in the LUT 650 provide the ability to predistort the scaled and offset digital envelope component signal ρ' and the digital phase component signals θ at n different predistortion levels. During operation, the controller 614 selects and retrieves from among the n different digital AM/AM and AM/PM predistortion coefficients, depending on the amplitude represented by the scaled and offset digital envelope component signal ρ'. The AM/AM predistorter 610 operates to predistort the scaled and offset digital envelope component signal ρ' according to the retrieved AM/AM predistortion coefficients, while the AM/PM predistorter 612 operates to predistort the digital phase component signal θ according to the retrieved AM/PM predistortion coefficients.

Figure 8:
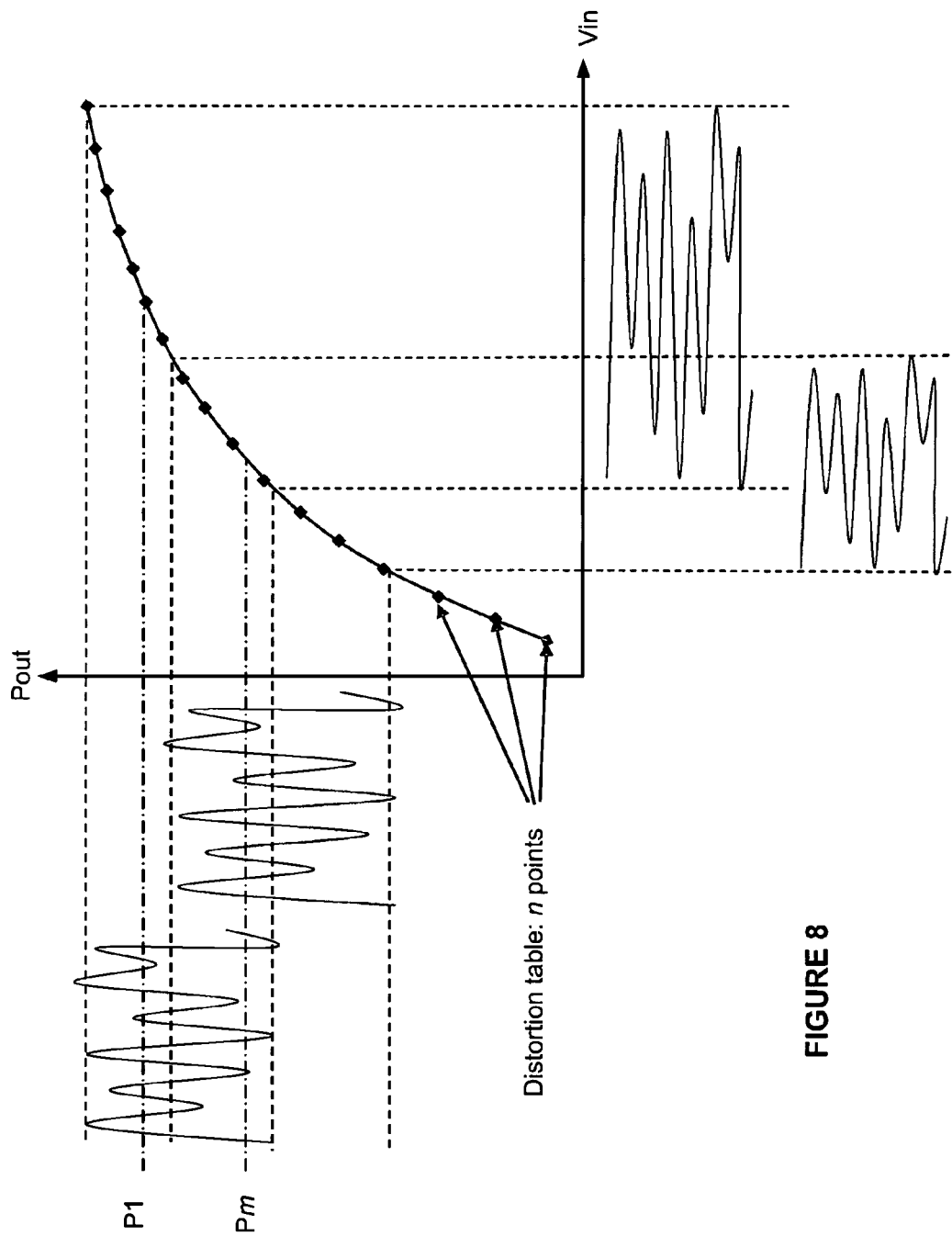
FIG. 8 is an AM/AM distortion curve that illustrates how scaling and offsetting the envelope component signal in the amplitude path of the polar modulation affords the ability to share the predistortion LUT over a plurality of average power levels the PA of the polar modulation transmitter can be commanded to operate.

FIG. 8 is an AM/AM distortion curve of the PA 640, illustrating how scaling and offsetting the digital envelope component signal p prior to applying predistortion affords the ability to share the same set of AM/AM predistortion coefficients {a1, ..., an} of the predistortion LUT 650 over the plurality of average power levels P1, P2, ..., Pm. When the PA 640 is commanded to operate at an average power level P1, the controller 614 responds by retrieving digital pre predistortion scale and offset parameters S1(P1) and O1(P1) from the memory 616. The first multiplier 606 and the first summer 608 then digitally scale and offset the digital envelope component signal p according to the digital pre predistortion scale and offset parameters S1(P1) and O1(P1). When operating at average power level P1, it can be seen by inspecting FIG. 8 that AM/AM predistortion coefficients corresponding to the upper eleven (11) points on the AM/AM distortion curve are used to predistort the scaled and offset digital envelope component signal ρ'. These eleven AM/AM predistortion coefficients comprise a first subset of AM/AM predistortion coefficients of the set of n AM/AM predistortion coefficients {a1, ..., an} making up the predistortion LUT 650. When the PA 640 is operating at a lower average power level Pm, the digital envelope component signal ρ is scaled using digital pre predistortion scale and offset parameters S1(Pm) and O1 (Pm), and a second subset of the same set of AM/AM predistortion coefficients {a1, ..., an} used to predistort the scaled and offset digital envelope component signal ρ' for average power level P1 is used to predistort the scaled and offset digital envelope component signal ρ' for average power level Pm. In other words, the predistortion LUT 650 is shared over multiple power levels. This ability to share the same predistortion LUT 650 over a multiple power levels obviates the need to determine and store multiple predistortion LUTs for multiple average power levels.

Following applying predistortion to the scaled and offset digital envelope component signal ρ' and the digital phase component signal θ, the resulting predistorted digital envelope and phase component signals ρ" and θ' appearing at the outputs of the AM/AM and AM/PM predistorters 610 and 612 are coupled to the first and second delay elements 620 and 632, respectively (see FIG. 6). The first and second delay elements 620 and 632 operate to balance the delays in the amplitude and phase paths by delaying the predistorted digital envelope and phase component signals ρ" and θ' by amounts determined by digital delay parameters τ(AM) and a τ(PM), respectively.

Following the delay adjustment in the amplitude path, the predistorted and delayed digital envelope component signal is digitally scaled and offset by the second multiplier 620 and the second summer 622, respectively, to further adjust power and performance, or, in an alternative embodiment to return the previously scaled digital envelope signal to it full scale modulation. The amount of scale and offset applied is determined by digital post predistortion scale and offset parameters S2(Px) and O2(Px) retrieved by the controller 614 from the memory 616. Which parameters are retrieved and used is determined by which of the average power levels of the plurality of power levels P1, P2, ..., Pm the PA 640 is operating and which of the pre predistortion scale and offset parameters S1(Px) and O1(Px) were applied to scale and offset the digital envelope component signal ρ prior to being predistorted. For example, if the PA 640 is operating at average power level P2, and pre predistortion scale and offset parameters S1(P2) and O1(P2) were used to scale and offset the digital envelope component signal ρ, the controller 614 would retrieve post predistortion scale and offset parameters S2(P2) and O2(P2) from the memory 616 and apply them to the second multiplier 620 and second summer 622.

The amplitude path DAC 626 converts the delayed, offset and scaled predistorted digital envelope component signal at the output of the second summer 622 into a predistorted analog amplitude modulation signal. The envelope modulator 628 modulates a DC power supply 630 according to the amplitude variation in the predistorted analog amplitude modulation signal, to produce a predistorted amplitude modulated power supply signal. Meanwhile, the phase path DAC 634 converts the delayed and predistorted digital phase component signal at the output of the second delay element 632 into a predistorted analog phase modulation signal. The predistorted analog phase modulation signal modulates an RF carrier signal generated by the oscillator 636, to produce a predistorted constant-envelope phase modulated RF signal. The predistorted constant-envelope phase modulated RF signal is coupled to the RF input of the PA 640 while the predistorted amplitude modulated power supply signal at the output of the envelope modulator 628 is coupled to the power supply input of the PA 640. The PA 640 is configured to operate in compression. Accordingly, it amplifies the predistorted constant-envelope phase modulated RF signal according to amplitude variations in the predistorted amplitude modulated power supply signal, to produce an amplitude and phase modulated RF signal that is radiated by the antenna 642 to a remote RF receiver. Due to the previously applied AM/AM and AM/PM predistortion, the amplitude and phase modulated RF signal has amplitude and phase characteristics that more closely resemble ideal amplitude and phase PA responses compared to if no predistortion had been applied.

The individual values of the various AM/AM and AM/PM predistortion coefficients of the predistortion LUT 650 are determined from a distortion characterization process performed on the PA 640 before the polar modulation transmitter 600 is placed into service. Because only a single predistortion LUT 650 needs to be determined, the test, characterization and evaluation time needed to determine the AM/AM and AM/PM predistortion coefficients is significantly reduced compared to prior art approaches.

Figure 9:
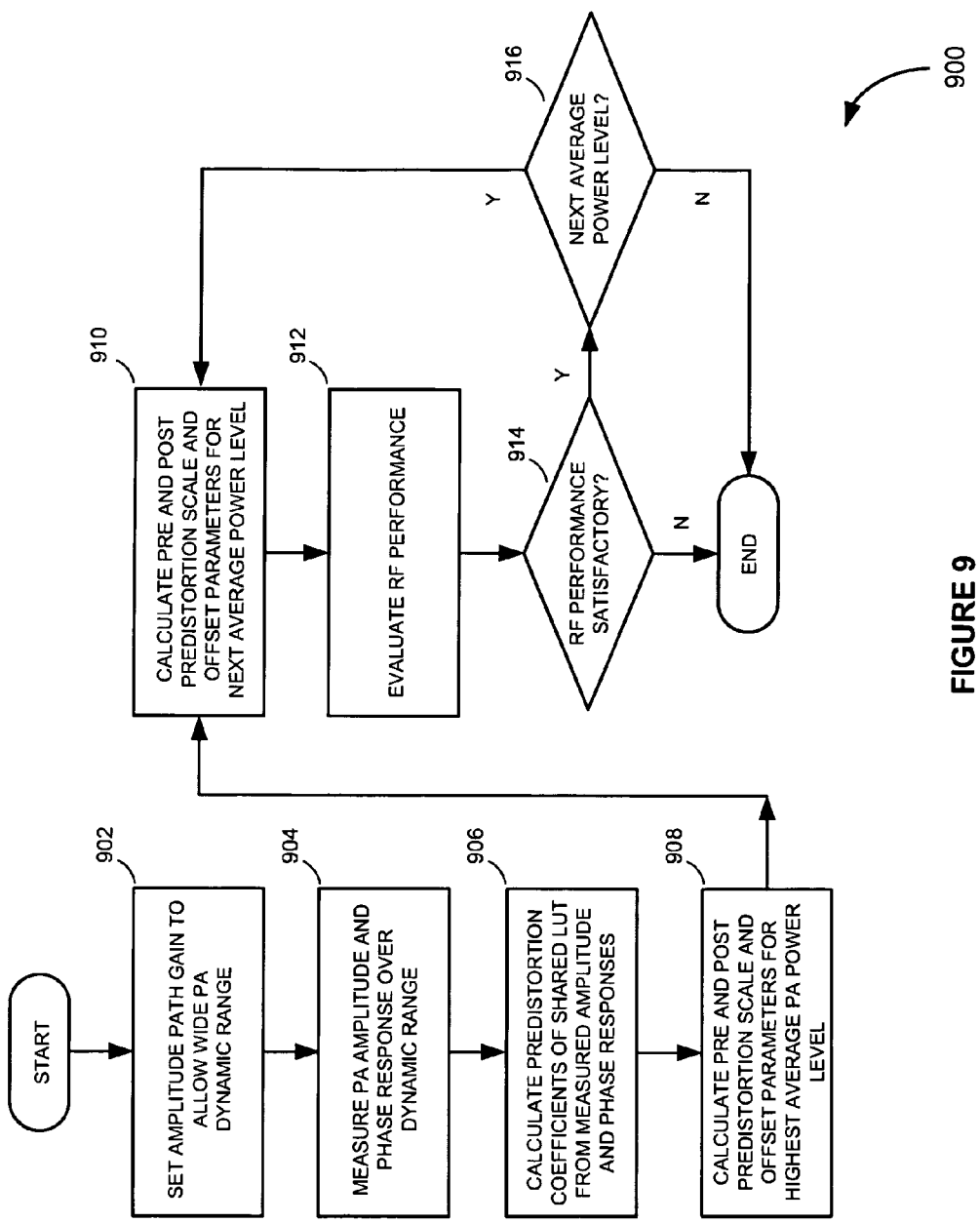
FIG. 9 is a flowchart of an exemplary method of determining the AM/AM and AM/PM predistortion coefficients of the shared predistortion LUT and the pre and post predistortion scale and offset parameters used by the polar modulation transmitter in FIG. 6, according to an embodiment of the present invention.

FIG. 9 is a flowchart illustrating an exemplary method 900 of determining the AM/AM and AM/PM predistortion coefficients of the predistortion LUT 650, and the pre and post predistortion scale and offset parameters S1(Px), O1(Px) and S2(Px), O2(Px), according to an embodiment of the invention. First, at step 902 the PA 640 is configured so that it can provide a wide dynamic range of output power. The dynamic range is determined by either the maximum dynamic range capability of the PA or by a dynamic range requirement established by a wireless communications standard. According to one embodiment of the invention, the polar modulation transmitter 600 comprises a multimode transmitter that is configurable to operate according to either of the GSM/EDGE and W-CDMA standards, and the power range over which the PA 612 is characterized is commensurate with or comparable to the required dynamic range in output power specified by the W-CDMA standard. Assigning appropriate values to the pre predistortion scale and offset parameters S1(Px) and O1(Px) (determined later in the method 900) allow the same predistortion LUT 650 to be shared whether the polar modulation transmitter 600 is configured for GSM/EDGE operation or for W-CDMA operation.

After the required dynamic range is established in step 902, at step 904 the amplitude and phase response of the PA 640 is measured over a range of input voltages, e.g., by applying a test ramp to the input of the PA 604.

Figure 10A:
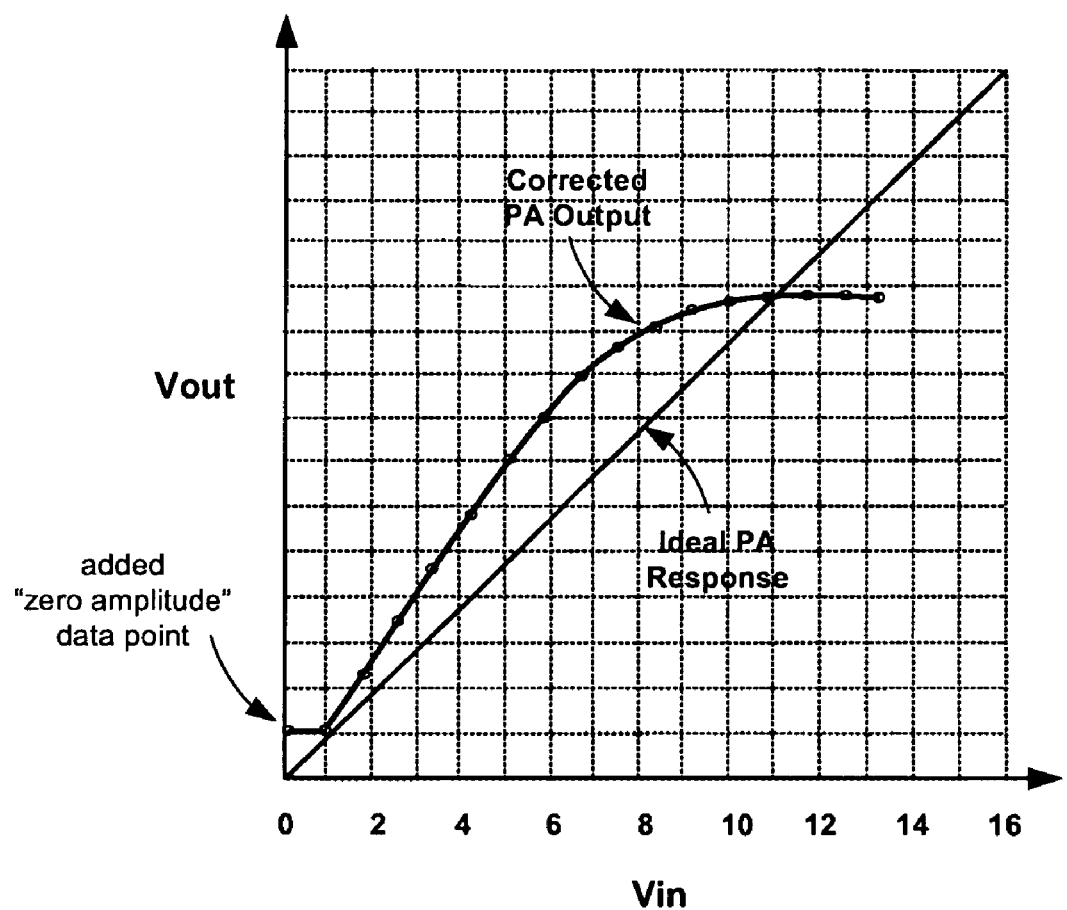
FIGS. 10A-10C are AM/AM distortion curves of a PA, illustrating various approaches of establishing a "zero-amplitude" AM/AM predistortion coefficient for the sets of AM/AM and AM/PM predistortion coefficients of the shared predistortion LUT used by the polar modulation transmitter in FIG. 6, according to embodiments of the present invention.
Figure 10B:
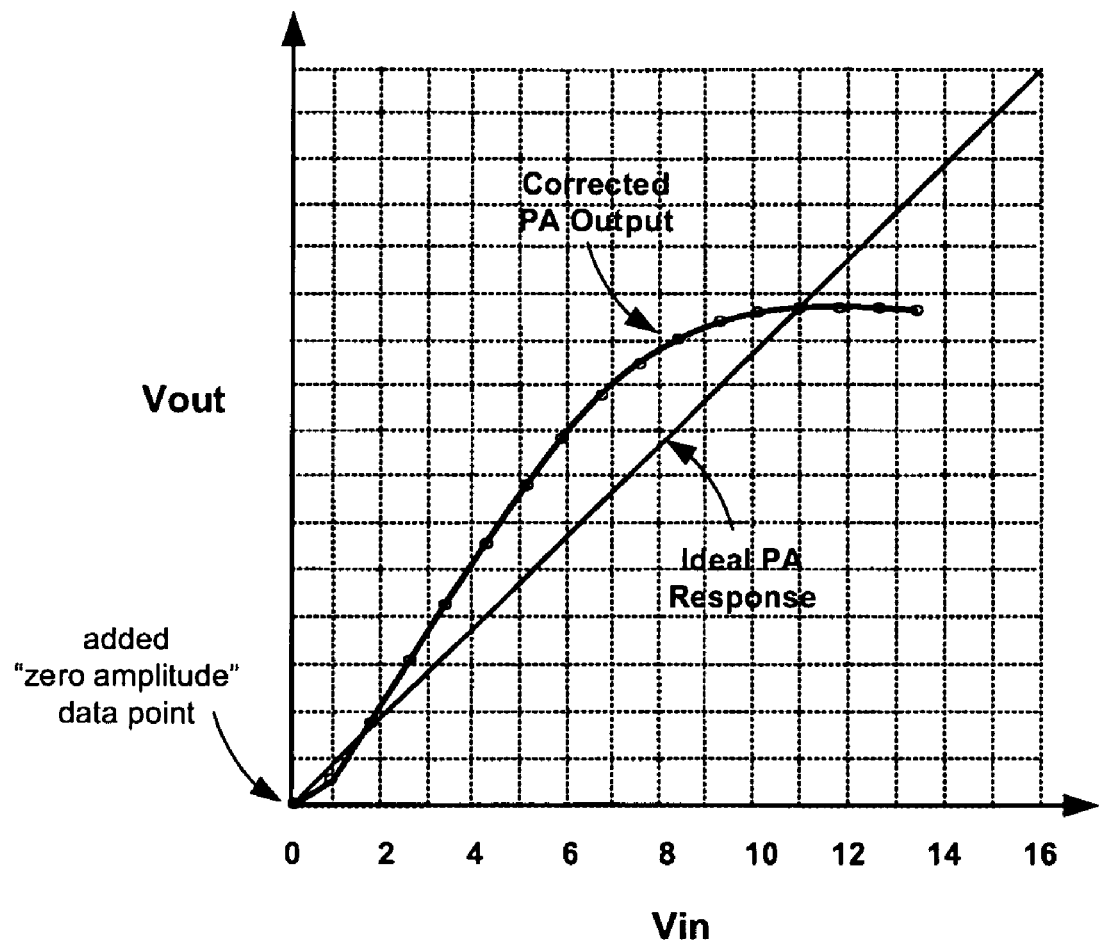
Figure 10C:
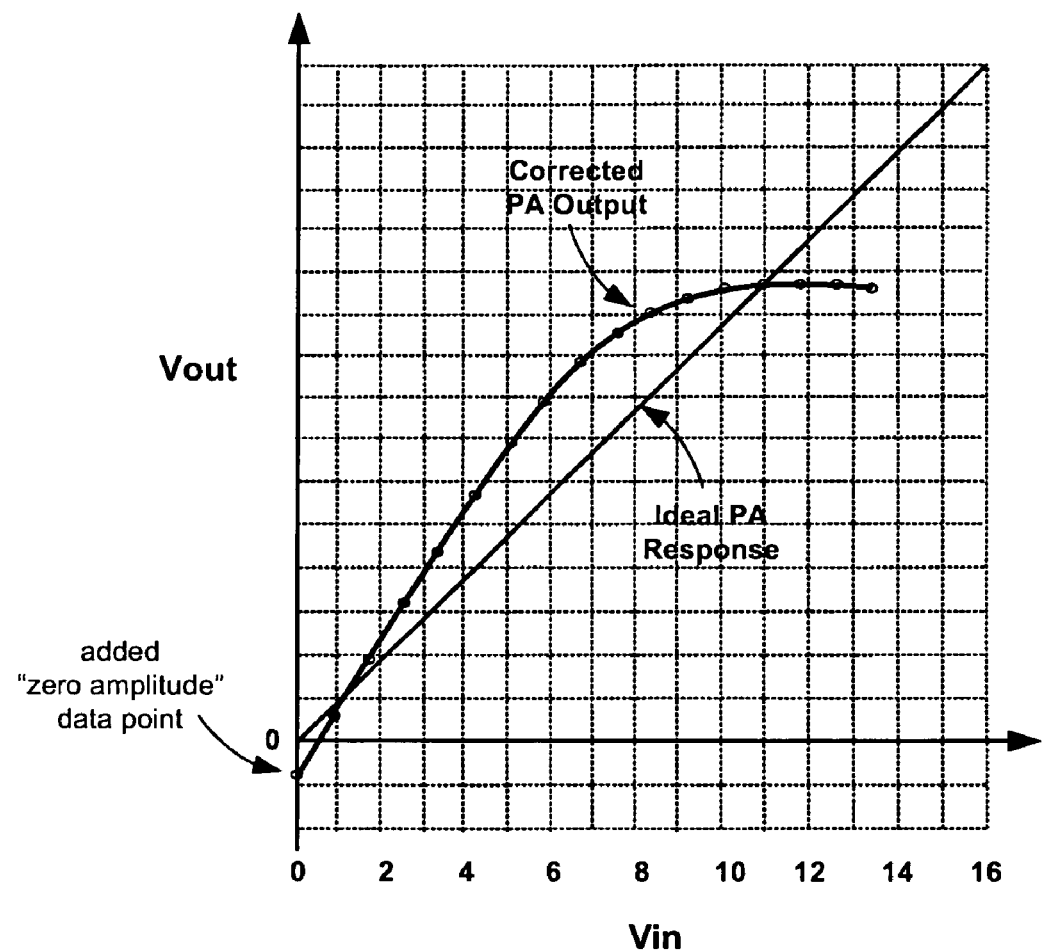

Based on AM/AM and AM/PM distortion curves characterizing the amplitude and phase responses of the PA 640 determined in step 904, at step 906 a plurality of AM/AM and AM/PM predistortion coefficients corresponding to a plurality of instantaneous input voltages along the AM/AM and AM/PM distortion curves are calculated to form the AM/AM and AM/PM predistortion coefficient sets {a1, . . . , an} and {p1, . . . , pn} More specifically, the AM/AM and AM/PM predistortion coefficient sets {a1, . . . , an} and {p1, . . . , pn} are each determined from an n-segment piece-wise function formed from n samples taken along the each of the AM/AM and AM/PM distortion curves. To account for limitations in the ability of the test equipment to accurately measure the amplitude response of the PA 640 when the input voltage is near zero, an unmeasured "zero-amplitude" data point is added to complete the n-segment piece-wise function in each of the AM/AM and AM/PM distortion curves. The added zero-amplitude data points may be determined in various ways. According to one embodiment illustrated in FIG. 10A, the zero-amplitude data point is assigned the same value as the nearest neighbor measured amplitude sample point. According to other embodiments illustrated in FIGS. 10B and 10C, the zero-amplitude data point is either set so that it has a value of zero (FIG. 10B) or is extrapolated using the two lowest measured amplitude sample points (FIG. 10C). Once the zero-amplitude data point has been added, digital values of the n AM/AM predistortion coefficients of the AM/AM predistortion coefficient set {a1, . . . , an} are calculated based on the extent to which each of the n segments (or each of the n+1 data points) deviates from the ideal amplitude response. A similar process is repeated to determine the zero-amplitude data point for the set of AM/PM predistortion coefficients.

At step 908, the values of the pre and post predistortion scale and offset parameters are calculated for the highest average output power level at which the PA 640 can be commanded to operate. For example, in FIG. 8 the highest average power level is P1. So, the pre predistortion scale and offset parameters S1(P1), O1(P1) and post predistortion scale and offset parameters S2(P1), O2(P1) are calculated for that average power level.

At step 910 the pre and post predistortion scale and offset parameters for the next lowest average power level is calculated by reducing the values of the pre and post predistortion scale and offset parameters determined for the previous highest average power level, so that the next lowest average power level can share the same predistortion LUT 650.

At step 912 the RF performance of the PA 640 is evaluated using the AM/AM and AM/PM predistortion coefficients determined in step 906 and the pre predistortion scale and offset parameters S1(Px), O1(Px) and post predistortion scale and offset parameters S2(Px), O2(Px) calculated in steps 908 and 910. The evaluation includes determining whether the RF signal at the output of the PA 640 complies with noise requirements specified by wireless standards when the PA 640 is configured to operate using the AM/AM and AM/PM predistortion coefficient sets {a1, . . . , an} and {p1, . . . , pn} and the pre and post predistortion scale and offset parameters S1(Px), O1(Px) and S2(Px), O2(Px).

At decision 914 if the RF performance of the PA 640 in step 912 is determined to be unsatisfactory, the method 900 ends. Otherwise, at decision 916 it is determined whether pre and post predistortion scale and offset parameters for the next lowest average power level needs to be calculated. If yes, steps 910-914 in the method 900 are repeated for the next lowest average power level. If no, the method 900 ends.

Figure 11:
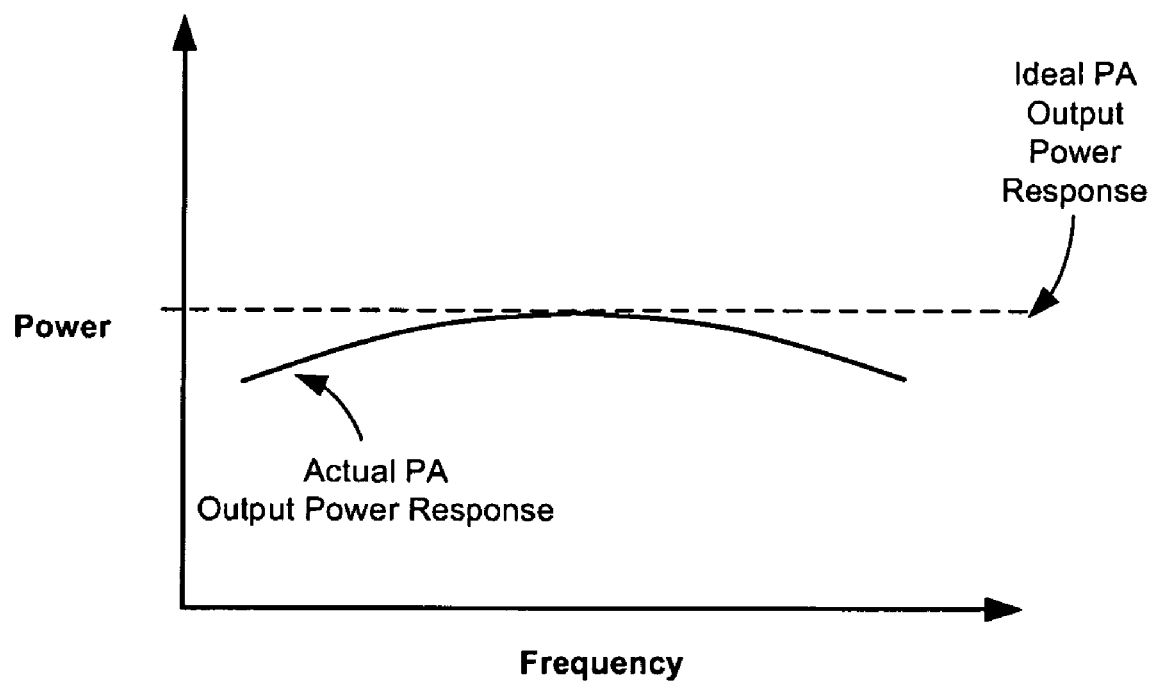
FIG. 11 is a graph illustrating how the output power of a PA typically depends on the frequency of the signal the PA amplifies.
Figure 13:
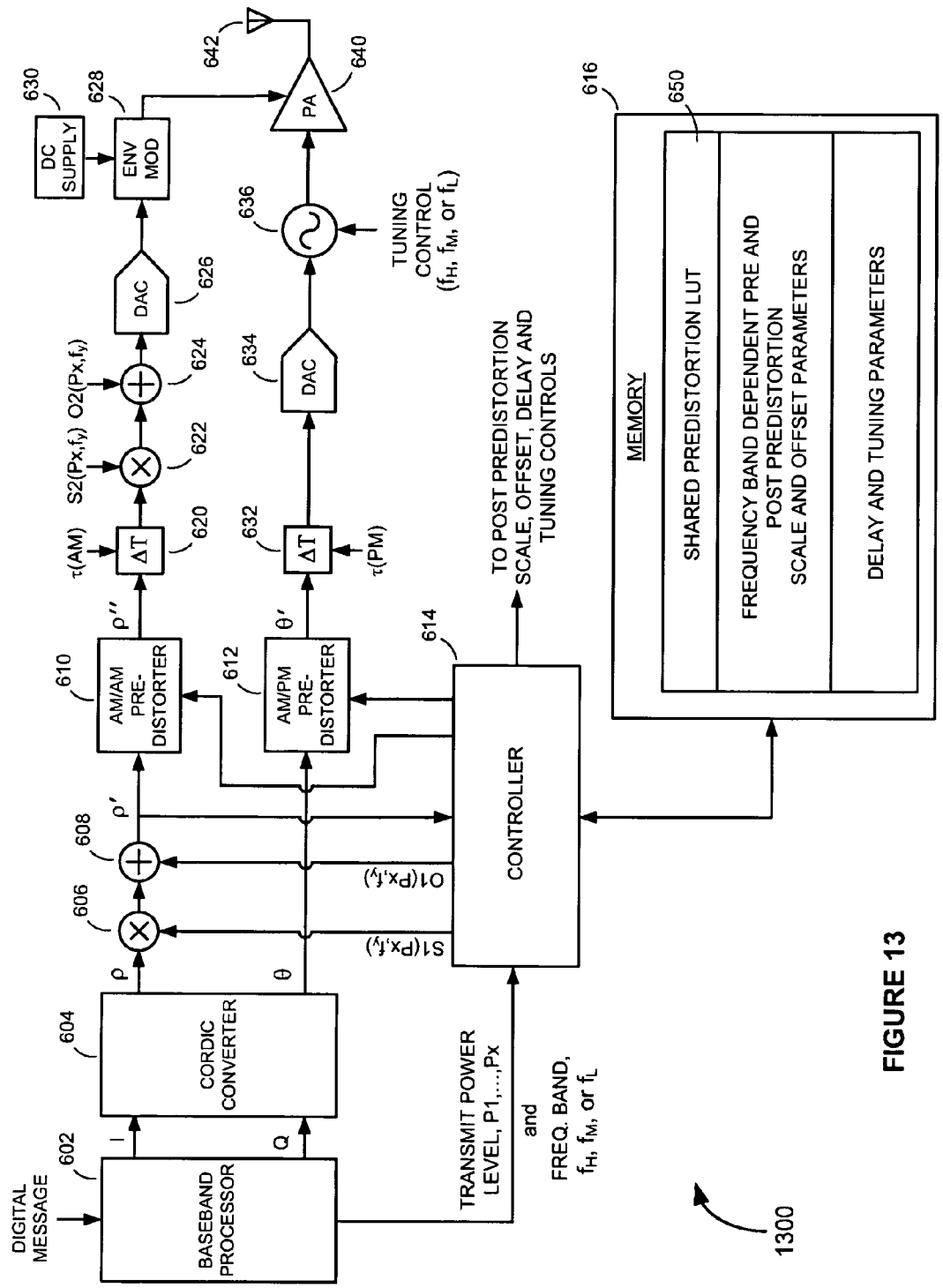
FIG. 13 is a drawing of a polar modulation transmitter that is configurable to operate according to a plurality of different frequency bands, and how the frequency-band-dependent pre and post predistortion scale and offset parameters are applied to the polar modulation transmitter when the polar modulation transmitter is configured to operate in a compressed mode.

According to one embodiment of the invention, the polar modulation transmitter 600 is configurable to operate according to multiple frequency bands. To account for frequency dependent variations in the output power of the PA 640 (see FIG. 11), the steps in the method 900 in FIG. 9 used to determine the pre and post predistortion scale and offset parameters are repeated to determine frequency band dependent scale and offset parameters to be used when the PA 640 of the polar modulation transmitter 600 is configured to operate in a compressed mode. FIG. 12 illustrates, for example, how, in addition to storing the shared predistortion LUT 650, the memory 616 is configured to store frequency band dependent pre and post predistortion scale and offset parameters S1(Px, $f_y$), O1(Px, $f_y$) and S2(Px, $f_y$), O2(Px, $f_y$) for low (L), medium (M) and high (H) bands (y={L, M, H}). During operation, the controller 614 retrieves the appropriate pre and post predistortion scale and offset parameters from the memory, depending on the transmit power level signal and a frequency band indication signal received from the baseband processor 602 (see FIG. 13). For example, if the transmit power level and a frequency band indication signals indicate that that the polar modulation transmitter is set to operate in the H band and the PA 640 is set to operate at an average power level P2, the pre and post predistortion parameters S1(P2, $f_H$), O1 (P2, $f_H$) and S2(P2, $f_H$), O2(P2, $f_H$) are retrieved and used to scale and offset the amplitude path signal before and after predistortion is applied.

When the PA 640 of the polar modulation transmitter 1300 is fully compressed, i.e., when the PA 640 is configured to operate in "compressed mode," as described above and illustrated in FIGS. 12 and 13, the instantaneous output power of the PA 640 is determined solely by the amplitude of the predistorted amplitude modulated power supply signal being applied to the power supply input of the PA 640. In other words, when configured for operation in compressed mode, the instantaneous output power of the PA 640 is independent of the amplitude of the signal being applied to the RF input of the PA 640. Under some operating conditions, however, the PA 640 may be configured so that the instantaneous output power is dependent solely on the amplitude of the phase modulated RF signal applied to the RF input of the PA 640, or is dependent on a combination of both the amplitude of the phase modulated RF signal and the amplitude of the amplitude modulated power supply signal. Although the PA 640 may not be operating entirely in its linear region at all times under either of these conditions and the PA may even still be compressed, to distinguish from the "compressed mode" operation described above, and to simplify the description that follows, the PA 640 will be referred to as operating in the "linear mode" during times when the instantaneous output power of the PA 640 is dependent on the amplitude of the phase modulated RF signal in the phase path of the polar modulation transmitter 600. The term "compressed mode" will be reserved for situations where the instantaneous output power of the PA is determined solely by the amplitude of the amplitude modulated power supply signal applied to the power supply input of the PA 640.

According to one embodiment of the invention, the dependency of the instantaneous PA output power on the amplitude of the phase modulated RF signal when the PA 640 is operating in the linear mode is exploited to obviate the need for frequency dependent pre and post predistortion scale and offset parameters. According to this embodiment of the invention, illustrated in FIG. 14, a variable gain amplifier (VGA) or step attenuator 1402 is disposed in the phase path of a polar modulation transmitter 1400, just before the PA 640. The gain of the VGA 1402 is controlled so that it compensates for frequency dependent variations in the instantaneous output power of the PA 640 when operating in different frequency bands. Gain control parameters $k_H(\hat{P}z)$, $k_M(\hat{P}z)$, $k_L(\hat{P}z)$ for a plurality of linear mode average power levels $\hat{P}1, \ldots, \hat{P}N$ are determined from PA power versus frequency measurements (e.g., by including one or more additional steps in the method 900 in FIG. 9), where N is an integer greater than or equal to one and indicates the number of different linear mode average power levels, and $z=\{1, \ldots, N\}$.

Figure 15:
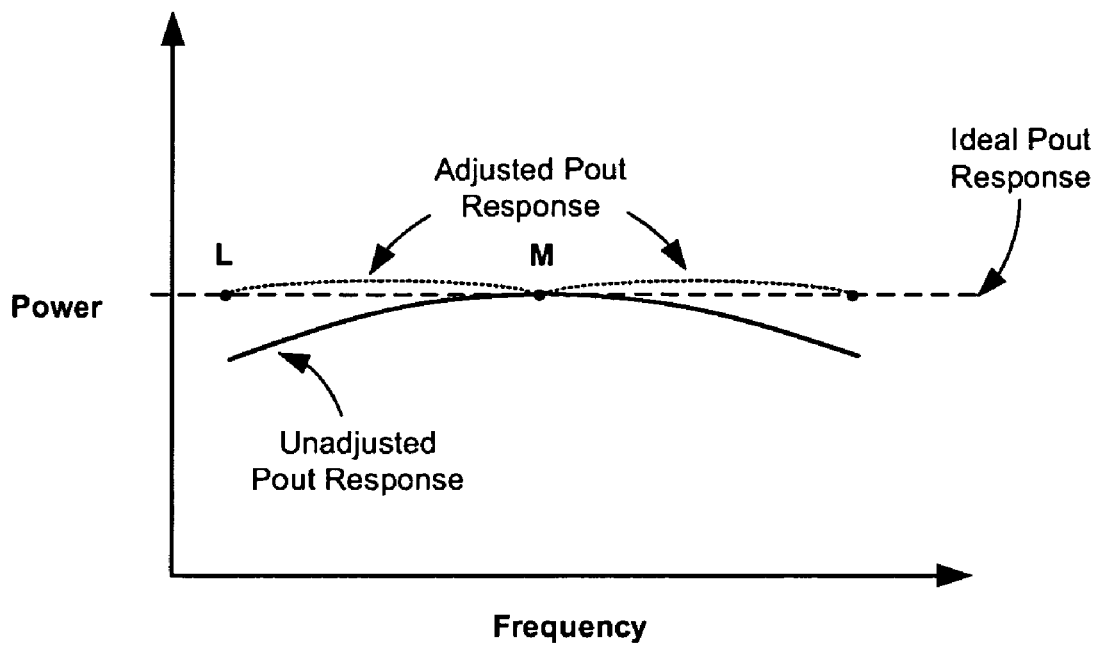
FIG. 15 is a graph illustrating how the attenuation of the PA can be interpolated to determine high (H), medial (M) and low (L) frequency band gain control parameters for use by the VGA in the polar modulation transmitter shown in FIG. 14 when the PA of the polar modulation transmitter is configured for operation in the linear mode, according to an embodiment of the present invention.
Figure 16:
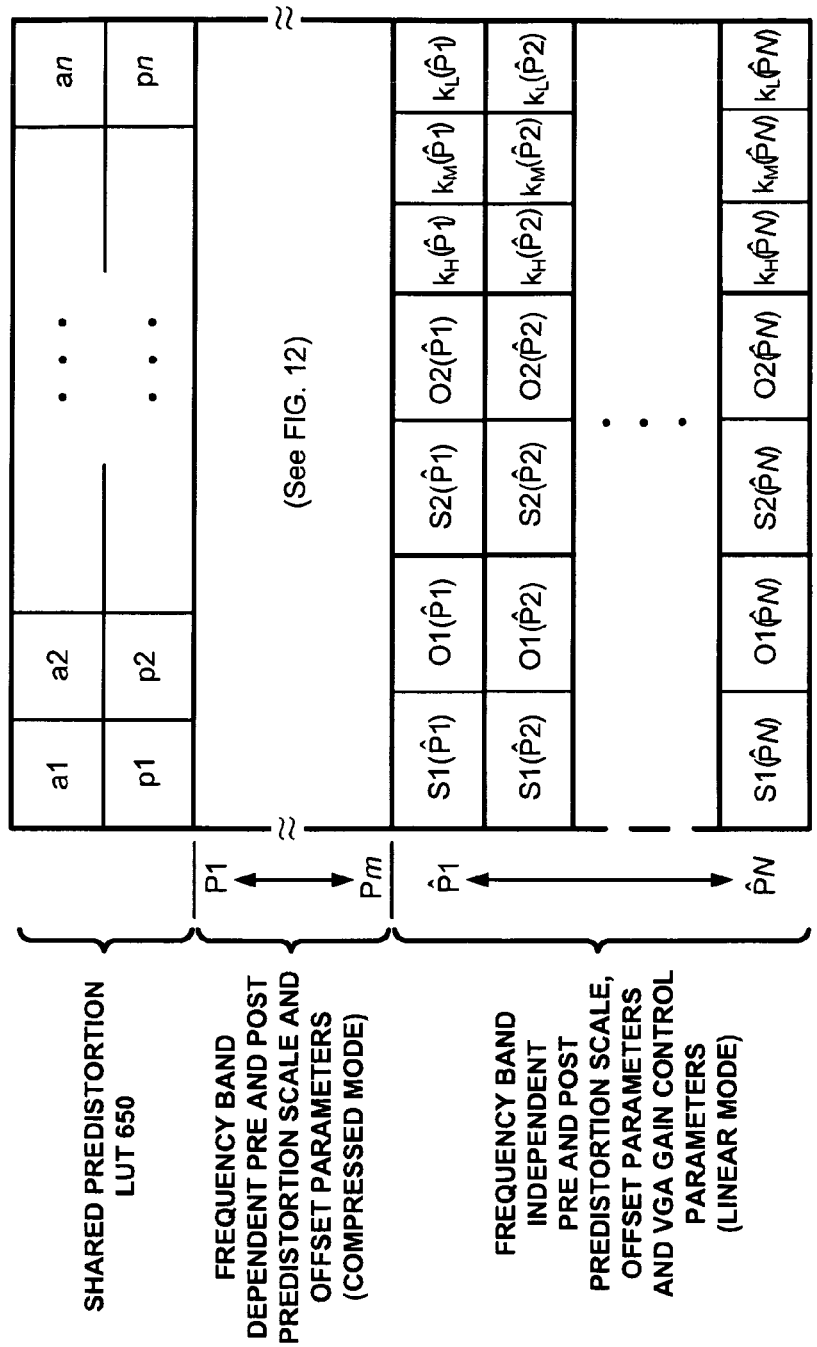
FIG. 16 is a drawing conceptually illustrating how the memory of the polar modulation transmitter in FIG. 15 is configured to store, in addition to the share predistortion LUT, frequency-band-independent pre and post predistortion scale and offset parameters and frequency-band-dependent VGA gain control parameters for a plurality of linear mode average power levels the PA of the polar modulation transmitter can be commanded to operate when in the linear mode.

Three gain control parameters $k_H(\hat{P}z)$, $k_M(\hat{P}z)$, $k_L(\hat{P}z)$ for each of the H, M and L frequency bands are determined, e.g., by interpolating the attenuation across the H, M and L frequency bands, as illustrated in FIG. 15. This approach is repeated for each of the linear mode average power levels $\hat{P}1, \ldots, \hat{P}N$, and the resulting gain control parameters $k_H(\hat{P}z)$, $k_M(\hat{P}z)$, $k_L(\hat{P}z)$ are stored in the memory 616, as conceptually illustrated in FIG. 16.

Figure 14:
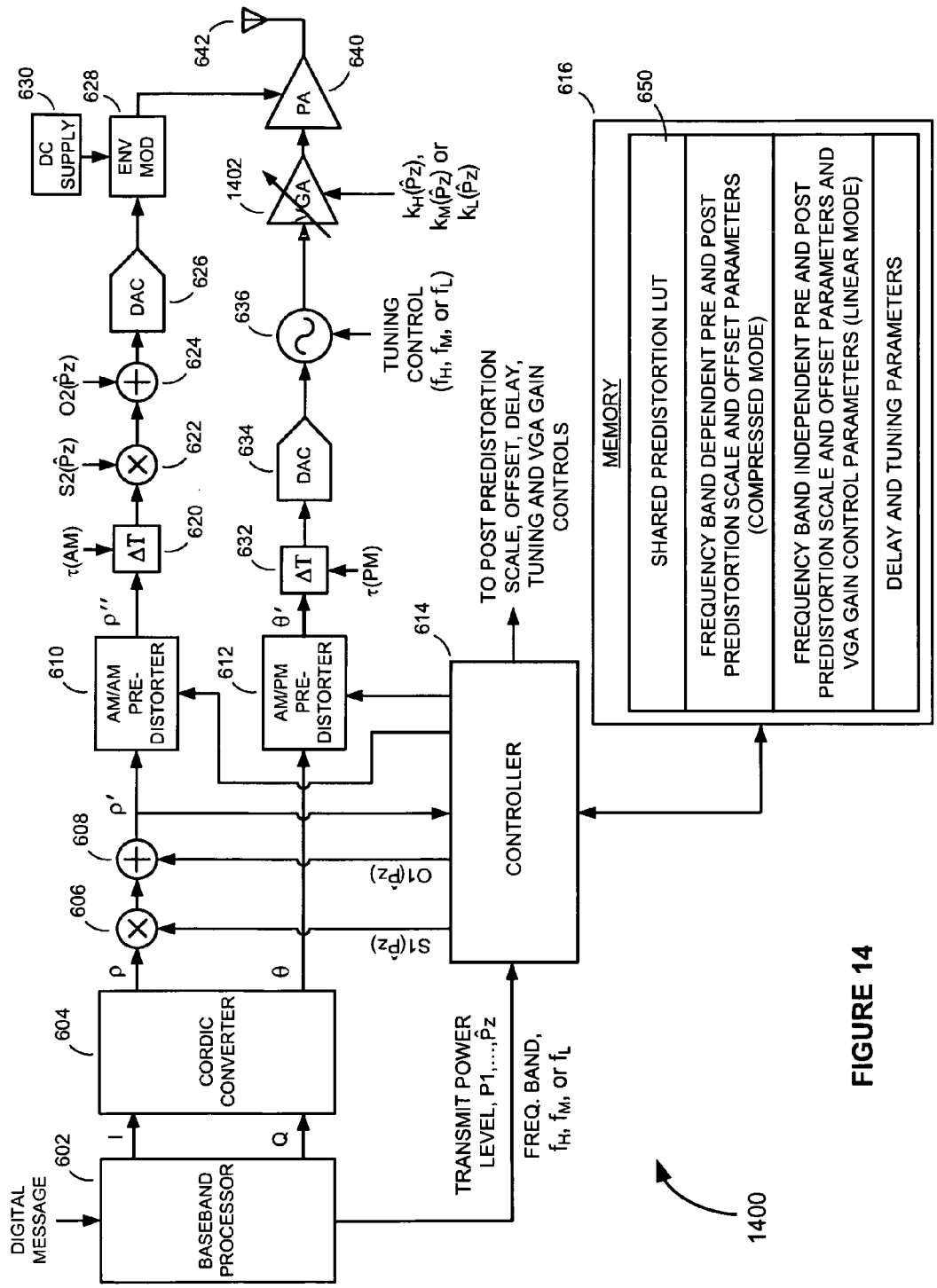
FIG. 14 is a drawing of a polar modulation transmitter that is configurable to operate according to a plurality of different frequency bands, illustrating how a variable gain amplifier (VGA) is employed in the phase path of the polar modulation transmitter to compensate for frequency dependent gain variations of the PA when the PA is configured to operate in a linear mode, according to an embodiment of the present invention.

During operation, when the PA 640 of the polar modulation transmitter 1400 is operating in linear mode, as in FIG. 14, the controller 614, in response to a transmit power level signal and a frequency band indicator signal from the baseband processor 602, retrieves the appropriate gain control parameter from the memory 616 and couples it to the gain control input of the VGA 1402. For example, if the transmit power level signal indicates that the PA 640 is currently operating at linear mode average power level $\hat{P}2$, and the frequency band indicator signal indicates that the PA 640 is operating in the H band, the gain control parameter $k_H(\hat{P}2)$ is retrieved from the memory 616 and applied to the gain control input of the PA 640. Using the VGA 1402 and gain control parameters $k_H(\hat{P}z)$, $k_M(\hat{P}z)$, $k_L(\hat{P}z)$ in linear mode allows the same sets of pre and post predistortion scale and offset parameters $S1(\hat{P}z)$, $O1(\hat{P}z)$ and $S2(\hat{P}z)$, $O2(\hat{P}z)$ to be used over all of the different frequency bands. Accordingly, unlike for compressed mode, in linear mode different pre and post predistortion scale and offset parameters do not need to be determined and stored for each frequency band. Memory resources are, therefore, conserved, and characterization, calculation and evaluation time are substantially reduced.

The present invention has been described with reference to specific exemplary embodiments. These exemplary embodiments are merely illustrative, and not meant to restrict the scope or applicability of the present invention in any way. For example, while the predistortion methods and apparatus have been described in the context of countering distortion effects in the PA of a polar modulation transmitter, those of ordinary skill in the art will appreciate and understand that the methods and apparatus may be modified for application in the context of other types of RF transmitters. Further, while described in the context of wireless applications, the methods and apparatus of the present invention may also be used in transmitters used in wired applications. Accordingly, the inventions should not be construed as being limited to any of the specific exemplary embodiments describe above, but should be construed as including any changes, substitutions and alterations that fall within the spirit and scope of the appended claims.

What is claimed is:

1. A method of predistorting signals in a polar modulation transmitter to counteract amplitude modulation to amplitude modulation (AM/AM) and amplitude modulation to phase modulation (AM/PM) distortion, comprising:

scaling an envelope component signal according to an average power-level-dependent scale parameter selected from a plurality of average power-level-dependent scale parameters depending on which average power level of the plurality of different average power levels that a power amplifier (PA) is configured to operate;

offsetting the scaled envelope component signal according to an average power-level-dependent offset parameter selected from a plurality of different average power-level-dependent offset parameters depending on which average power level of the plurality of different average power levels that the PA is configured to operate;

predistorting the scaled envelope component signal in an amplitude path of the polar modulation transmitter according to a set of AM/AM predistortion coefficients of a predistortion look up table (LUT);

after predistorting the scaled envelope component signal, further scaling the scaled envelope component signal according to second average power-level-dependent scale parameter selected from a plurality of the second average power-level-dependent scale parameters depending on which average power level of the plurality of different average power levels that the PA is configured to operate;

after further scaling the scaled envelope component signal, offsetting the further scaled envelope component signal according to second average power-level-dependent offset parameter selected from a plurality of the second average power-level-dependent offset parameters depending on which average power level of the plurality of different average power levels that the PA is configured to operate, and predistorting a phase component signal in a phase path of the polar modulation transmitter according to a set of AM/PM predistortion coefficients of said predistortion LUT, wherein the sets of AM/AM and AM/PM predistortion coefficients of said predistortion LUT are shared over a plurality of different average power levels that the PA of polar modulation transmitter can be commanded to operate.

2. The method of claim 1 wherein, when the PA of the polar modulation transmitter is configured to operate in a compressed mode, scaling the envelope component signal comprises scaling the envelope component signal according to a frequency-band-dependent scale parameter selected from a plurality of frequency-band-dependent scale parameters corresponding to the plurality of different average power levels.

3. The method of claim 1 wherein, when the PA of the polar modulation transmitter is configured to operate in a linear mode, scaling the envelope component signal comprises scaling the envelope component signal according to a frequency-independent scale parameter selected from a plurality of frequency-independent scale parameters corresponding to a plurality of different linear mode average power levels that the PA can be configured to operate while operating in the linear mode.

4. The method of claim 3, further comprising controlling the amplitude of a predistorted phase modulated signal in the phase path to counteract frequency dependent attenuation of the phase modulated signal when amplified by the PA.

5. A polar modulation transmitter having an amplitude path and a phase path, comprising:
   a memory configured to store a plurality of amplitude modulation to amplitude modulation (AM/AM) predistortion coefficients and a plurality of amplitude modulation to phase modulation (AM/PM) predistortion coefficients in the form of a predistortion look up table (LUT);
   an AM/AM predistorter configured in the amplitude path operable to generate a predistorted envelope component signal according to the AM/AM predistortion coefficients of said predistortion LUT;
   an AM/PM predistorter configured in the phase path operable to generate a predistorted phase component signal according to the AM/PM predistortion coefficients of said predistortion LUT; and
   a power amplifier (PA) configurable to operate at one of a plurality of different average power levels, said PA having a first input configured to receive a predistorted amplitude modulated power supply signal that is predistorted according to predistortions in the predistorted envelope component signal, and a second input configured to receive a predistorted phase modulated signal that is predistorted according to predistortions in the predistorted phase component signal,
   wherein the plurality of AM/AM and AM/PM predistortion coefficients of said predistortion LUT are shared over the plurality of different average power levels that the PA is configurable to operate, wherein
   after predistorting the envelope component signal, scaling the envelope component signal according to second average power-level-dependent scale parameter selected from a plurality of the second average power-level-dependent scale parameters depending on which average power level of the plurality of different average power levels that the PA is configured to operate; and
   after scaling the envelope component signal, offsetting the scaled envelope component signal according to second average power-level-dependent offset parameter selected from a plurality of the second average power-level-dependent offset parameters depending on which average power level of the plurality of different average power levels that the PA is configured to operate.

6. The polar modulation transmitter of claim 5, further comprising a first multiplier configured to scale said envelope component signal according to a scale parameter having a value dependent upon which average power level of said plurality of different average power levels that the PA is configured to operate.

7. The polar modulation transmitter of claim 6, further comprising a first summer configured to apply an offset to said envelope component signal according to an offset parameter having a value dependent upon which average power level of said plurality of different average power levels that the PA is configured to operate.

8. The polar modulation transmitter of claim 7 wherein said PA is configurable to operate in either a compressed mode or a linear mode and according to a plurality of different frequency bands, and, when configured to operate in said compressed mode, the scale and offset parameters comprise frequency-band-dependent scale and offset parameters.

9. The polar modulation transmitter of claim 8, further comprising a variable gain amplifier having an output coupled to the RF input of the PA and a gain control input configured to receive a gain control parameter when the polar modulation transmitter is configured to operate in linear mode, said gain control parameter having a value determined by which frequency band of the plurality of different frequency bands the polar modulation transmitter is configured to operate.

10. The polar modulation transmitter of claim 5 wherein the polar modulation transmitter is configurable to operate according to multiple wireless communications standards and the same predistortion LUT is used to predistort the envelope and phase component signals in the polar modulation transmitter when the polar modulation transmitter is configured to operate according to any one of the multiple wireless communication standards.

11. The polar modulation transmitter of claim 5 wherein said sets of AM/AM and AM/PM predistortion coefficients of said predistortion LUT comprise sets of frequency-band-dependent AM/AM and AM/PM predistortion coefficients for predistorting the envelope and phase component signals at a plurality of different frequency bands that the polar modulation transmitter is configured to be tuned to operate when the PA is configured to operate in a compressed mode.

12. A polar modulation transmitter, comprising:
   a power amplifier (PA) having a power supply input and a radio frequency (RF) input;
   means for storing a set of amplitude modulation to amplitude modulation (AM/AM) predistortion coefficients and a set of amplitude modulation to phase modulation (AM/PM) predistortion coefficients in the form of a predistortion look up table (LUT);
   means for generating a predistorted envelope component signal using the set of AM/AM predistortion coefficients of said predistortion LUT;
   means for generating a predistorted amplitude modulated power supply signal for the power supply input of the PA from the predistorted envelope component signal;
   means for generating a predistorted phase component signal using the set of AM/PM predistortion coefficients of said predistortion LUT;
   means for generating a predistorted phase modulated RF signal for the RF input of the PA from the predistorted phase component signal; and
   means for sharing the sets of AM/AM and AM/PM predistortion coefficients of said predistortion LUT over a plurality of different average power levels that the PA can be commanded to operate, and
   means for adjusting the amplitude of the predistorted phase modulated RF signal applied to the RF input of the PA at a plurality of different frequency bands the polar modulation transmitter can be tuned to operate when the PA is configured to operate in a linear mode,
   wherein the AM/AM and AM/PM predistortion coefficients used to predistort the envelope and phase component signals, when the PA is configured to operate in the linear mode, have frequency-independent values for the plurality of different frequency bands, and said means for storing the sets of AM/AM and AM/PM predistortion coefficients is further configured to store a plurality of frequency-band-dependent gain control parameters, for each linear mode average power level of a plurality of linear mode average power levels that the PA can be commanded to operate when the polar modulation transmitter is configured to operate in the linear mode.

13. A method of determining amplitude modulation to amplitude modulation (AM/AM) predistortion coefficients and amplitude modulation to phase modulation (AM/PM) predistortion coefficients of a predistortion look-up-table (LUT) and other predistortion parameters for a polar modulation transmitter, comprising:

measuring, over a predetermined dynamic range of output power, AM/AM and AM/PM distortion responses of a power amplifier (PA) to be used in the power modulation transmitter;

calculating AM/AM and AM/MP predistortion coefficients for the predistortion LUT from the measured AM/AM and AM/PM distortion responses of the PA;

for a highest average power level that the PA can be commanded to operate when configured in the polar modulation transmitter and the polar modulation transmitter is placed into service, calculating a pre predistortion scale parameter to be used to scale an envelope component signal in an amplitude path of the polar modulation transmitter when the polar modulation transmitter is placed into service; and for other average power levels below the highest average power level that the PA can be commanded to operate when configured in the polar modulation transmitter and the polar modulation transmitter is placed into service, calculating other pre predistortion scale parameters to be used to scale the envelope component signal when the polar modulation transmitter is placed into service, and wherein calculating the pre predistortion scale parameters for the highest average power level and calculating the pre predistortion scale parameters for the other plurality of average power levels are repeated for a plurality of different frequencies to determine a plurality of frequency-band-dependent pre predistortion scale parameters used to scale the envelope component signal when the polar modulation transmitter is placed into service with the PA operating in a compressed mode, wherein which frequency-band-dependent pre predistortion scale parameter of the plurality of frequency-band-dependent pre predistortion scale parameters is used to scale the envelope component signal when the polar modulation transmitter is placed into service with the PA operating in compressed mode is determined by which average power level of the plurality of average power levels that the PA is commanded to operate and which frequency band of a plurality of different frequency bands the polar modulation is tuned.

14. The method of claim 13, further comprising:

for the highest average power level that the PA can be commanded to operate when the polar modulation transmitter is placed into service, calculating a pre predistortion offset parameter to be used to apply an offset to the scaled envelope component signal; and for other average power levels below the highest average power level that the PA can be commanded to operate when the polar modulation transmitter is placed into service, calculating other pre predistortion offset parameters to be used to apply an offset to the scaled envelope component signal.

15. The method of claim 13 wherein the AM/AM predistortion coefficients correspond to a plurality of measured sample points along an AM/AM distortion curve characterizing the measured AM/AM distortion response and the AM/PM predistortion coefficients correspond to a plurality of measured sample points along an AM/PM distortion curve characterizing the measured AM/PM distortion response.

16. The method of claim 15, further comprising:

determining a zero-amplitude AM/AM predistortion coefficient from one or more of the measured sample points of the AM/AM distortion curve; and determining a zero-amplitude AM/PM predistortion coefficient from one or more of the measured sample points of the AM/PM distortion curve.

17. The method of claim 16 wherein determining the zero-amplitude AM/AM predistortion coefficient comprises assigning the value of the AM/AM predistortion coefficient of the lowest-amplitude measured sample point on the AM/AM distortion curve to the zero-amplitude AM/AM predistortion coefficient, and determining the zero-amplitude AM/PM predistortion coefficient comprises assigning the value of the AM/PM predistortion coefficient of the lowest-amplitude measured sample point on the AM/PM distortion curve to the zero-amplitude AM/PM predistortion coefficient.

18. The method of claim 16 wherein determining the zero-amplitude AM/AM predistortion coefficient comprises assigning a value of zero to the zero-amplitude AM/AM predistortion coefficient, and determining the zero-amplitude AM/PM predistortion coefficient comprises assigning a value of zero to the zero-amplitude AM/PM predistortion coefficient.

19. The method of claim 16 wherein determining the zero-amplitude AM/AM predistortion coefficient is determined from a straight line curve or a polynomial curve fitted to measured sample points along the AM/AM distortion curve, and determining the zero-amplitude AM/PM predistortion coefficient is determined from a straight line curve or a polynomial curve fitted to measured sample points along the AM/PM distortion curve.

20. A method of determining amplitude modulation to amplitude modulation (AM/AM) predistortion coefficients and amplitude modulation to phase modulation (AM/PM) predistortion coefficients of a predistortion look-up-table (LUT) and other predistortion parameters for a polar modulation transmitter, comprising:

measuring, over a predetermined dynamic range of output power, AM/AM and AM/PM distortion responses of a power amplifier (PA) to be used in the power modulation transmitter;

calculating AM/AM and AM/MP predistortion coefficients for the predistortion LUT from the measured AM/AM and AM/PM distortion responses of the PA;

for a highest average power level that the PA can be commanded to operate when configured in the polar modulation transmitter and the polar modulation transmitter is placed into service, calculating a pre predistortion scale parameter to be used to scale an envelope component signal in an amplitude path of the polar modulation transmitter when the polar modulation transmitter is placed into service; and for other average power levels below the highest average power level that the PA can be commanded to operate when configured in the polar modulation transmitter and the polar modulation transmitter is placed into service, calculating other pre predistortion scale parameters to be used to scale the envelope component signal when the polar modulation transmitter is placed into service;

measuring a frequency response of the PA when the PA is configured to operate in a linear mode; and based on the measured frequency response, and for each linear mode average power level of a plurality of linear mode average power levels the PA can be commanded to operate when the polar modulation transmitter is placed into service with the PA operating in linear mode, calculating a plurality of frequency-band-dependent gain control parameters to be applied to a variable gain amplifier preceding the PA, wherein which frequency-band-dependent gain control parameter of the calculated plurality of frequency-band-dependent gain control parameters is applied to the variable gain amplifier when the polar modulation transmitter is placed into service is determined by which linear mode average power level that the PA is commanded to operate and which of a plurality of different frequency bands the polar modulation transmitter is tuned to.

21. A polar modulation transmitter comprising:

a power amplifier (PA) having a power supply input and a radio frequency (RF) input;

means for storing a set of amplitude modulation to amplitude modulation (AM/AM) predistortion coefficients and a set of amplitude modulation to phase modulation (AM/PM) predistortion coefficients in the form of a predistortion look up table (LUT);

means for generating a predistorted envelope component signal using the set of AM/AM predistortion coefficients of said predistortion LUT;

means for generating a predistorted amplitude modulated power supply signal for the power supply input of the PA from the predistorted envelope component signal;

means for generating a predistorted phase component signal using the set of AM/PM predistortion coefficients of said predistortion LUT;

means for generating a predistorted phase modulated RF signal for the RF input of the PA from the predistorted phase component signal; and means for sharing the sets of AM/AM and AM/PM predistortion coefficients of said predistortion LUT over a plurality of different average power levels that the PA can be commanded to operate; wherein after predistorting the envelope component signal, sealing the envelope component signal according to second average power-level-dependent scale parameter selected from a plurality of the second average power-level-dependent scale parameters depending on which average power level of the plurality of different average power levels that the PA is configured to operate; and after predistorting the scaled envelope component signal, offsetting the scaled envelope component signal according to second average power-level-dependent offset parameter selected from a plurality of the second average power-level-dependent offset parameters depending on which average power level of the plurality of different average power levels that the PA is configured to operate.

22. The polar modulation transmitter of claim 21 wherein said sets of AM/AM and AM/PM predistortion coefficients of said predistortion LUT comprise sets of frequency-band-dependent AM/AM and AM/PM predistortion coefficients for predistorting the envelope and phase component signals at a plurality of different frequency bands that the polar modulation transmitter is configured to be tuned to operate when the PA is configured to operate in a compressed mode.

* * * * *

UNITED STATES PATENT AND TRADEMARK OFFICE
CERTIFICATE OF CORRECTION

| | | |
|---|---|---|
| PATENT NO. | : 8,081,711 B2 | Page 1 of 1 |
| APPLICATION NO. | : 12/098314 | |
| DATED | : December 20, 2011 | |
| INVENTOR(S) | : Wayne S. Lee et al. | |

It is certified that error appears in the above-identified patent and that said Letters Patent is hereby corrected as shown below:

In the Claims:

Col. 15, line 14, Claim 13: "AM/MP" should read --AM/PM--;
Col. 16, line 45, Claim 20: "AM/MP" should read --AM/PM--

Signed and Sealed this
Fourteenth Day of February, 2012

David J. Kappos
*Director of the United States Patent and Trademark Office*